(12) United States Patent
Su (10) Patent No.: US 8,376,557 B2
(45) Date of Patent: Feb. 19, 2013

(54) HOUSING WITH FOOT PADS AND COUPLERS

(75) Inventor: Feng-Ching Su, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 40 days.

(21) Appl. No.: 13/092,152

(22) Filed: Apr. 22, 2011

(65) Prior Publication Data

US 2012/0217859 A1    Aug. 30, 2012

(30) Foreign Application Priority Data

Feb. 25, 2011    (CN) ...................... 2011 2 0048494 U (51) Int. Cl.
| | |
|---|---|
| A47B 91/00 | (2006.01) |
| F16M 11/20 | (2006.01) |
| B65D 51/18 | (2006.01) |
| G06F 1/16 | (2006.01) |
| H05K 5/00 | (2006.01) |
| H05K 7/00 | (2006.01) |
| G03B 21/14 | (2006.01) |
| G03B 21/22 | (2006.01) |
| B65D 47/00 | (2006.01) |
| B67D 3/00 | (2006.01) |

(52) U.S. Cl. .................. 353/119; 248/188.8; 220/254.3; 361/679.59; 222/561

(58) Field of Classification Search ................. 312/10.1, 312/351.1, 245; 220/818, 817, 810, 254.4, 220/254.3, 254.1; 248/558, 188.8, 342; 348/825; 353/119, 70; 403/348–353; 361/679.59; 215/235; 222/534, 553, 554, 555, 561, 562, 222/563

See application file for complete search history.

(56) References Cited

U.S. PATENT DOCUMENTS

| | | | | |
|---|---|---|---|---|
| 1,806,295 | A * | 5/1931 | Kinnard | 248/27.1 |
| 1,942,310 | A * | 1/1934 | Stahl | 220/818 |
| 2,274,752 | A * | 3/1942 | Straub | 222/545 |
| 2,625,306 | A * | 1/1953 | Murphy | 222/498 |
| 2,753,051 | A * | 7/1956 | Tupper | 210/239 |
| 2,941,236 | A * | 6/1960 | Monroe et al. | 16/368 |
| 3,045,860 | A * | 7/1962 | Desgagne | 220/254.3 |
| 4,535,908 | A * | 8/1985 | Dabich | 220/484 |
| 5,286,129 | A * | 2/1994 | French et al. | 403/24 |
| 5,688,030 | A * | 11/1997 | McAnally et al. | 312/223.2 |
| 7,108,447 | B2 * | 9/2006 | Akkala et al. | 404/25 |
| 7,270,306 | B2 * | 9/2007 | Chen | 248/188.2 |
| 7,387,220 | B2 * | 6/2008 | Verespej et al. | 222/153.01 |
| 7,399,090 | B2 * | 7/2008 | Oda | 353/119 |
| 7,530,457 | B2 * | 5/2009 | Tsang | 206/320 |
| 7,621,643 | B2 * | 11/2009 | Hirosawa et al. | 353/58 |

(Continued)

*Primary Examiner* — Janet M Wilkens
*Assistant Examiner* — Andrew Roersma
(74) *Attorney, Agent, or Firm* — Altis Law Group, Inc.

(57) ABSTRACT

A housing includes a wall, a connector, a coupler, and a foot pad. The housing includes a bottom surface, a recess defined in the bottom surface, and a discontinuous ring-shaped engagement member surrounding the recess. The engagement member has a first gap and a second gap aligned with the first gap. The connector is connected to the engagement member and is rotatably engaged in the first gap. The coupler includes a main body and an engagement portion extending from a circumference surface thereof. A first engagement hole defined in a central portion of the main body. The main body is rotatably connected to the connector and engagable in the recess. The engagement portion engages in the second gap. The foot pad is connected to the coupler to seal the first engagement hole and received in the recess.

18 Claims, 7 Drawing Sheets

U.S. PATENT DOCUMENTS

| | | | |
|---|---|---|---|
| 7,931,166 B2* | 4/2011 | Cuocolo, Jr. | 220/254.2 |
| 7,959,117 B2* | 6/2011 | Chiu | 248/188.1 |
| 2005/0286027 A1* | 12/2005 | Bakkom et al. | 353/119 |
| 2006/0061738 A1* | 3/2006 | Rizzo | 353/119 |
| 2007/0080094 A1* | 4/2007 | Moon | 206/581 |
| 2007/0211229 A1* | 9/2007 | Kitahara | 353/119 |
| 2009/0122280 A1* | 5/2009 | Kuroda | 353/119 |
| 2010/0001150 A1* | 1/2010 | Chiu | 248/188.8 |

* cited by examiner

HOUSING WITH FOOT PADS AND COUPLERS

BACKGROUND

1. Technical Field

The present disclosure relates to a housing with a number of foot pads and a number of couplers.

2. Description of Related Art

Some items such as clocks, television sets, and digital photo frames may be configured for placement in many ways. Such as being hung on a wall by use of a hook, supported on a surface such as on a table or desk, or suspended from a ceiling. Often, items supported on a surface are provided with a number of foot pads to provide traction for the items. If the item is to be suspended from the ceiling, a number of couplers are provided on the housing for coupling with a hook on the ceiling. However, locations of the foot pads and locations of the couplers are generally different. Thus, the foot pads and couplers occupy too much space of the housing, and the foot pads and the couplers interact in assembly.

Therefore, it is desirable to provide a housing with foot pads and couplers, which can overcome or at least alleviate the above-mentioned problems.

DETAILED DESCRIPTION

Figure 1:
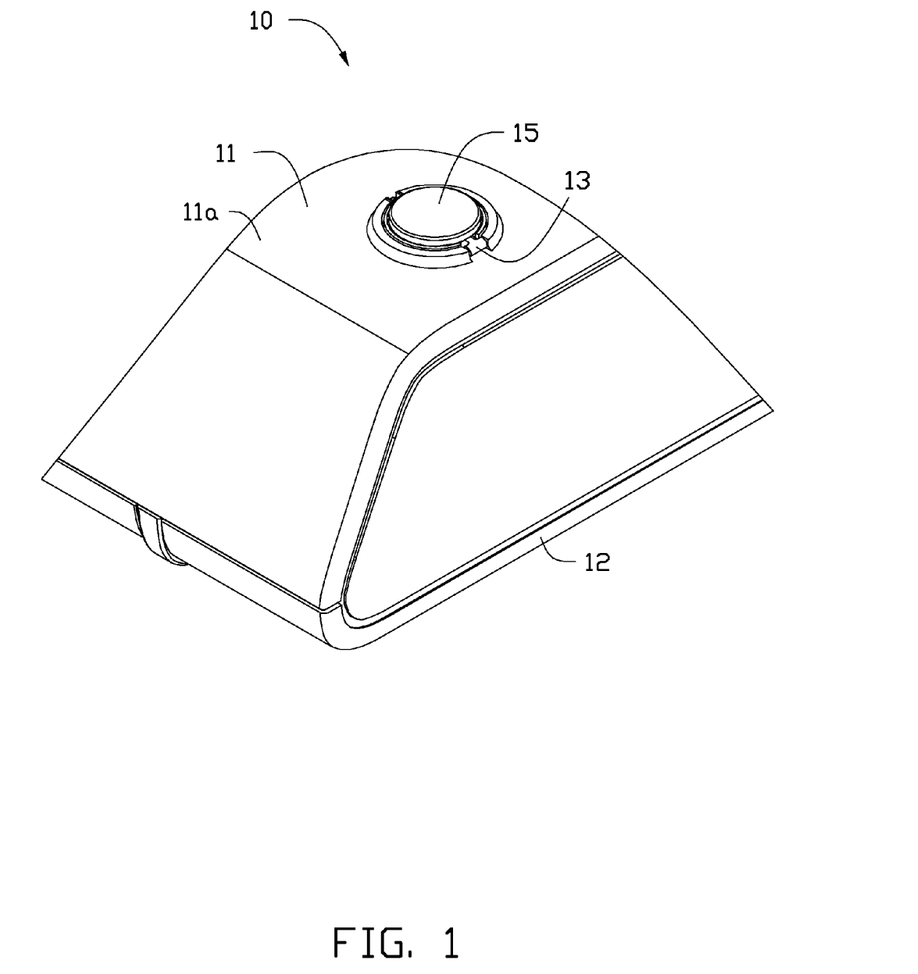
FIG. 1 is a schematic, isometric partial view of a housing according to a first exemplary embodiment, the view showing one foot pad of a number of foot pads, one coupler of a number of couplers, and a wall of the housing on which the foot pad is exposed.
Figure 2:
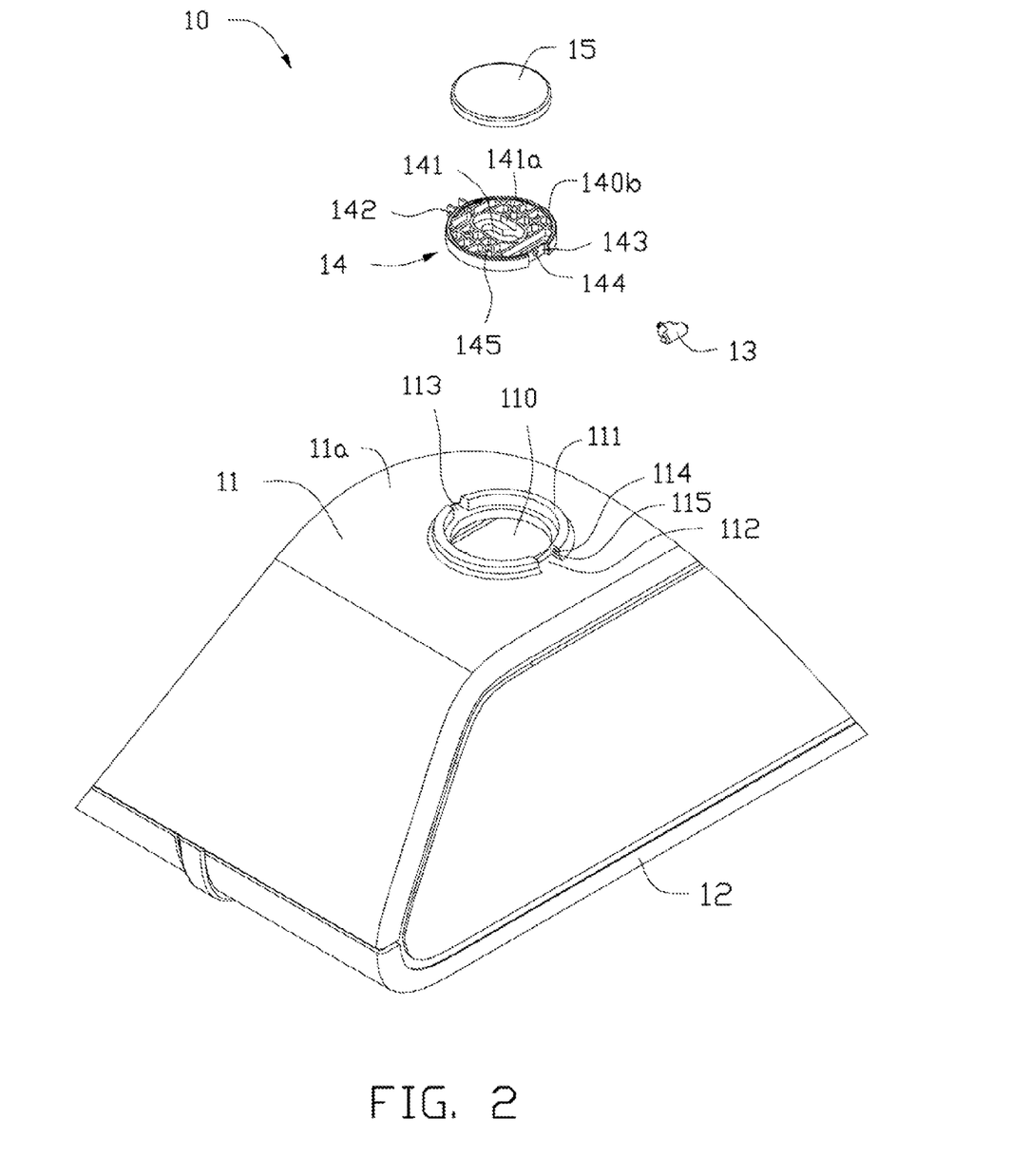
FIG. 2 is an exploded view of the housing of FIG. 1.

Referring to FIGs. 1-2, a housing, 10, according to a first exemplary embodiment, includes a wall 11, a cover 12 covering the wall 11, four connectors 13(only one shown), four couplers 14 (only one shown), and four foot pads 15 (only one shown). In this embodiment, the housing 10 is a portion of a projector, and houses electronic and mechanical parts of the projector. When the projector is to be used on a supporting surface, such as a desk, the projector is oriented with the wall 11 down to contact the support surface. When the projector is to be suspended from a ceiling, it is oriented with the wall 11 up and engaged with a suspension means attached to the ceiling. In this orientation, the projector is adjusted so that projected images do not appear upside-down on the projection surface.

The wall 11 includes a bottom surface 11a and an engagement member 111. A through hole 110 is defined in the bottom surface 11a to provide a space for movement of the coupler 14 and the foot pad 15. The engagement member 111 surrounds the through hole 110. The engagement member 111 is a discontinuous ring with a first gap 112 and a second gap 113. The first gap 112 is aligned with the second gap 113. Two fixing holes 114 are defined in opposite sidewalls 115 of the first gap 112, respectively. In other embodiments, the through hole 110 can be replaced by a recess or a blind hole.

Figure 3:
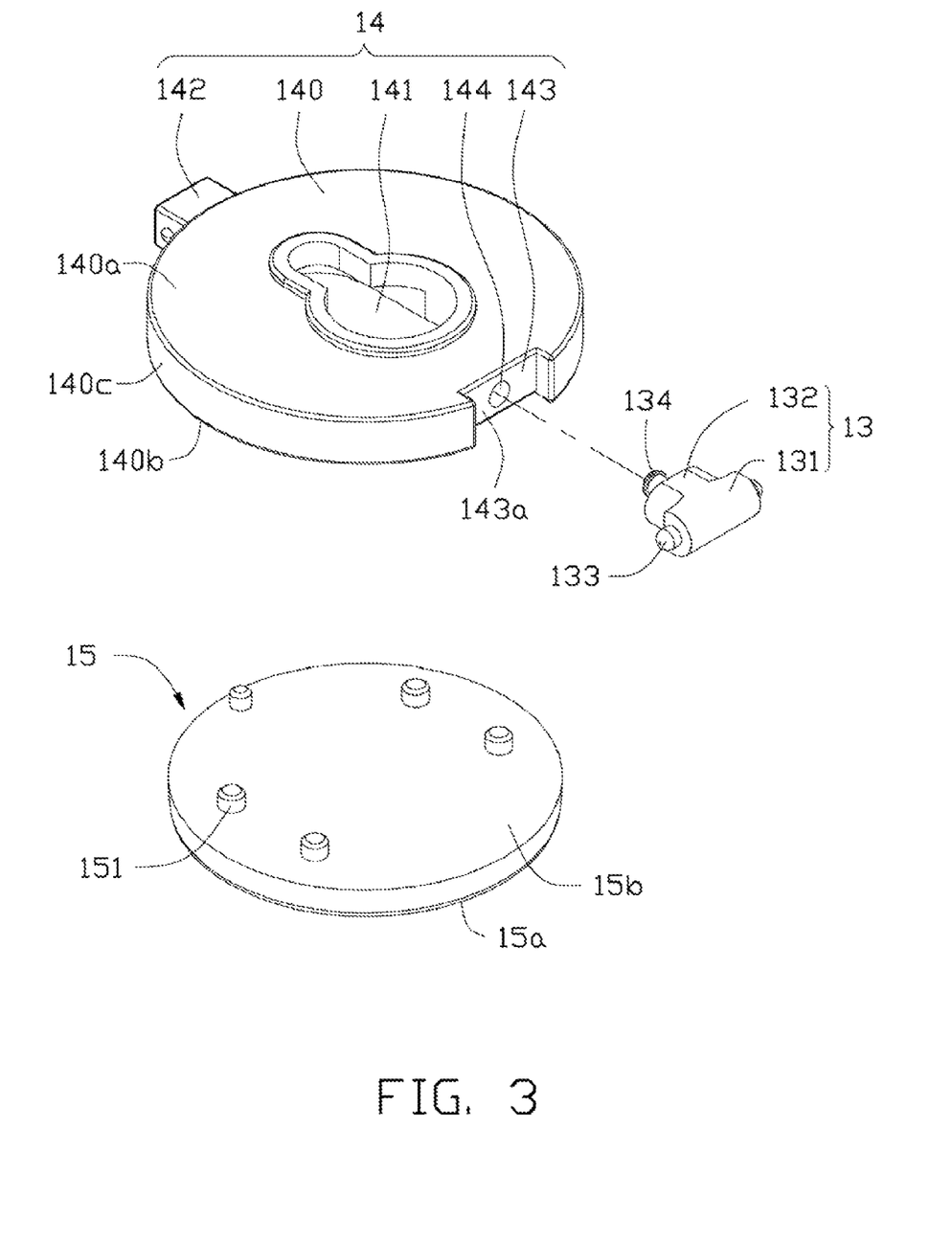
FIG. 3 is a partial exploded view of the housing of FIG. 1.

Referring to FIGS. 2-3, the connector 13 is T-shaped and includes a first body portion 131 and a second body portion 132 substantially perpendicular to the first body portion 131. Two first protrusions 133 extend from opposite sides of the first body portion 131. The two first protrusions 133 rotatably engage in the respective fixing holes 114 so that the connector 13 is mounted in the first gap 112 of the wall 11. A second protrusion 134 extends from the second body portion 132 along the lengthwise direction thereof.

Figure 6:
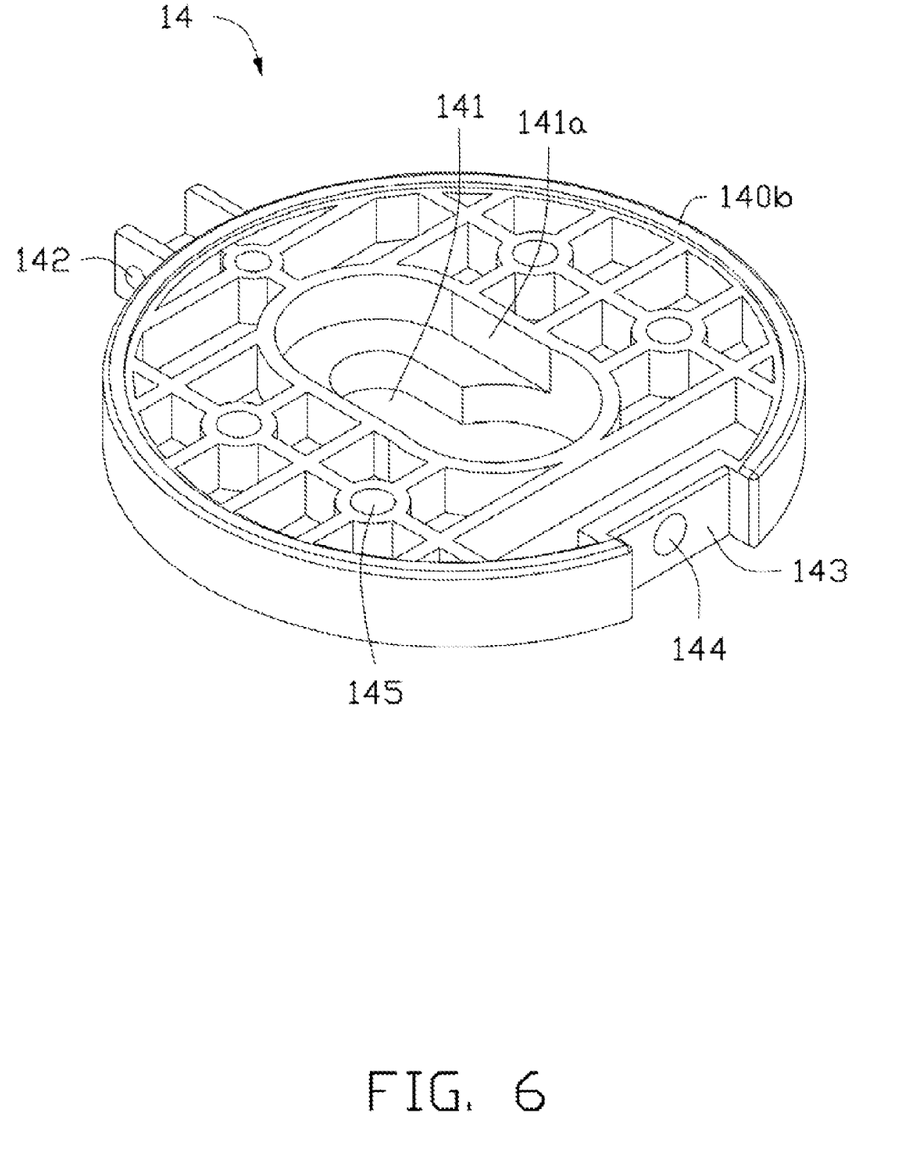
FIG. 6 is a enlarged view of a coupler of the housing of FIG. 2.

The coupler 14 includes a circular main body 140 and an engagement portion 142. The main body 140 includes a first surface 140a, a second surface 140b opposite to the first surface 140a, and a circumference surface 140c connecting the first surface 140a to the second surface 140b. A first engagement hole 141 is defined in a center portion of the main body 140 from the first surface 140a to the second surface 140b. The first engagement hole 141 conforms to a suspension means (not shown) extending from a wall/ceiling (not shown). An opening 141a (best seen in FIG. 6) is defined in the second surface 140b surrounding the first engagement hole 141. Five second engagement holes 145 are defined in the second surface 140b around the first engagement hole 141 and the opening 141a. The engagement portion 142 extends from the circumference surface 140c. The engagement portion 142 is shaped to match with the second gap 113. A cutout 143 is defined in the circumference surface 140c and aligned with the engagement portion 142. A blind hole 144 is defined in a bottom 143a of the cutout 143 corresponding to the second protrusion 134.

The foot pad 15 is substantially circular. The foot pad 15 includes a first plane 15a, a second plane 15b, and five posts 151. The first plane 15a is opposite to the second plane 15b. The second plane 15b faces the second surface 140b. The five posts 151 extend from the second plane 15b corresponding to the five second engagement holes 145. The foot pad 15 may be made of nonskid material such as plastic or rubber.

In assembly, the first protrusions 133 rotatably engage in the respective fixing holes 114 so that the connector 13 is mounted in the first gap 112 of the wall 11. The posts 151 engage in the respective second engagement holes 145 so that the foot pad 15 is connected to the coupler 14 and seals the opening 141a. The second protrusion 134 rotatably engages in the blind hole 144 so that the coupler 14 and the foot pad 15 are connected to the connector 13. The engagement portion 142 engages in the second gap 113 so that the main body 140 and the foot pad 15 are received in the through hole 110 and the foot pad 15 is exposed on the wall 11.

Figure 4:
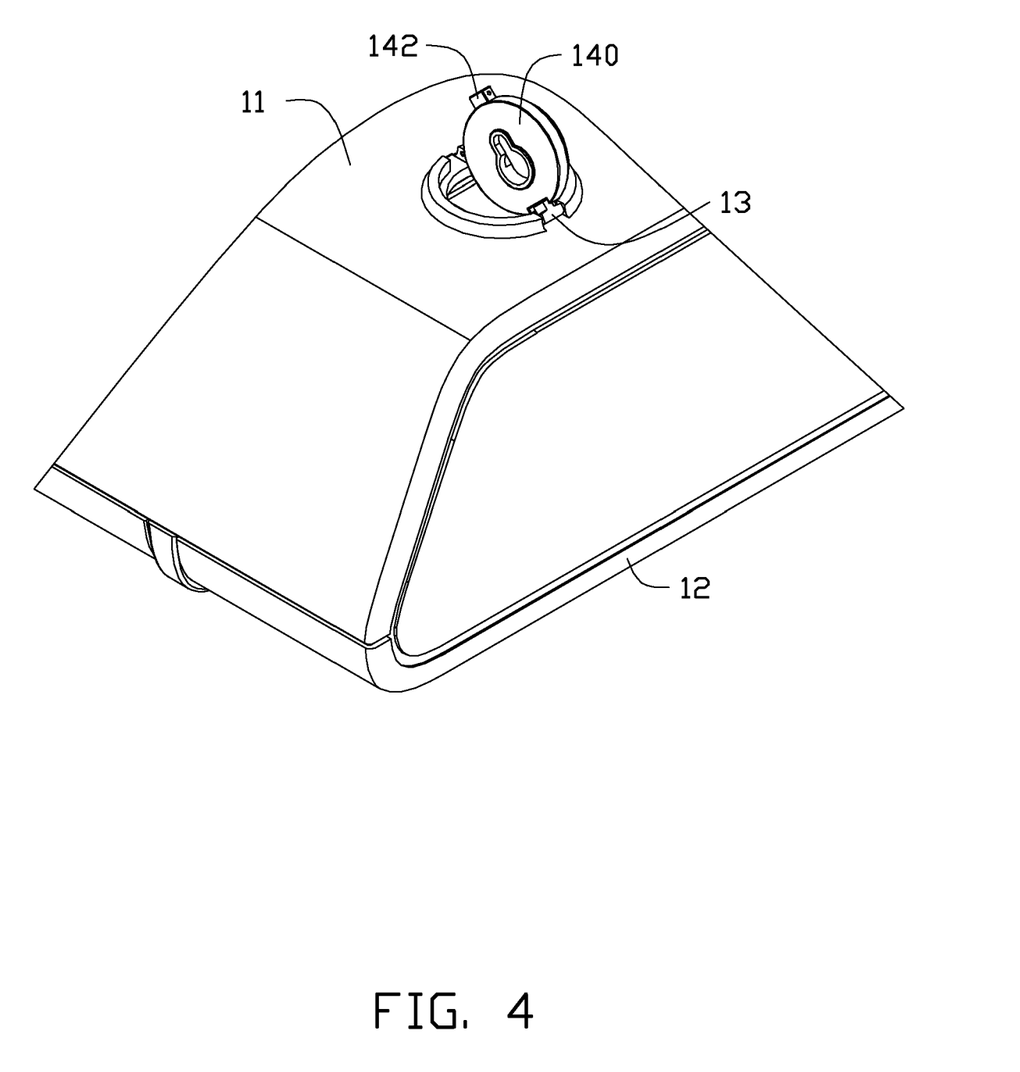
FIG. 4 is similar to FIG. 1, but showing the foot pad being rotated to an interior of the housing.
Figure 5:
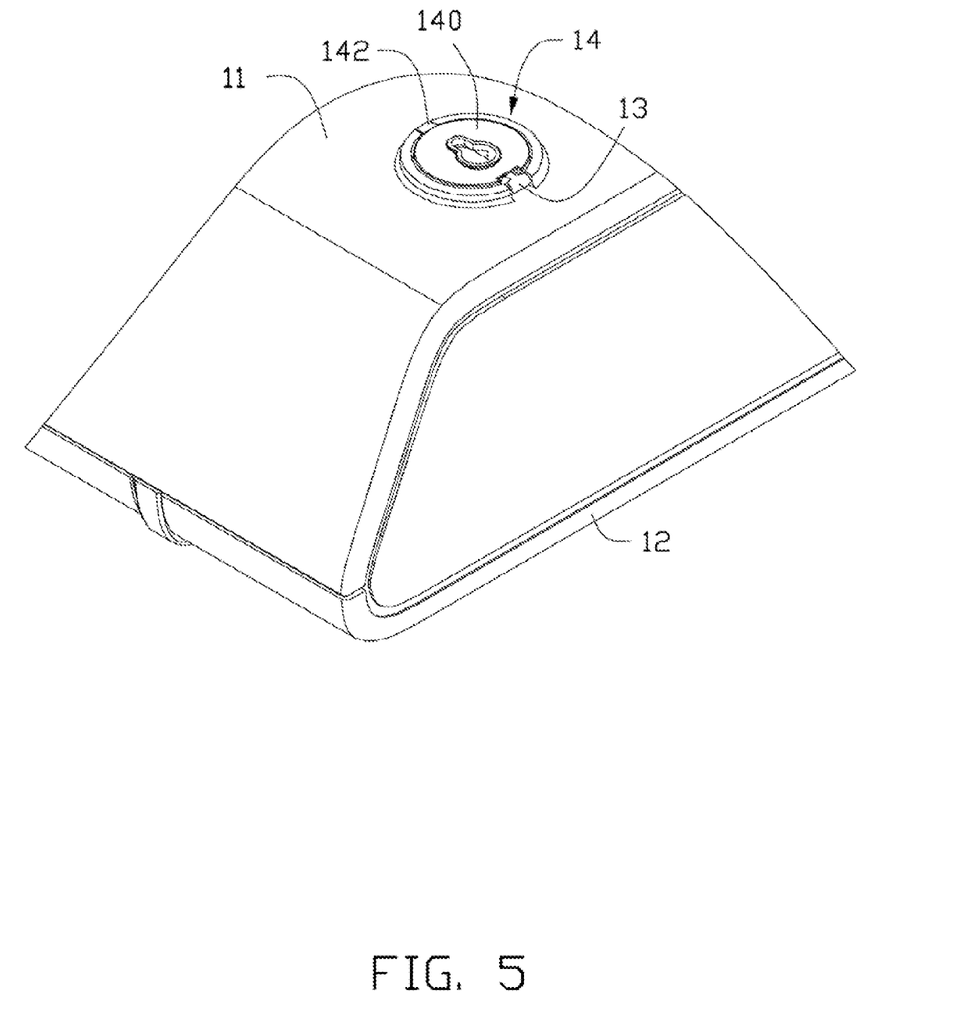
FIG. 5 is similar to FIG. 2, but showing the coupler exposed.

Referring to FIGs, 1, 4 and 5, when the housing 10 is in operation, the housing 10 is put on a table (not shown) to work. The foot pad 15 contacts the table and provides traction. If the housing 10 is hung from the ceiling/wall to work, the main body 140 and the second body portion 132 rotate about a lengthwise axis of the first body portion 131 to release the engagement portion 142 from the second gap 113. The main body 140 is then rotated about a lengthwise axis of the second body portion 132 until the first surface 140a is exposed on the wall 11. The main body 140 and the second body portion 132 are then rotated about a lengthwise axis of the first body portion 131 to engage the engagement portion 142 in the second gap 113. Therefore, the main body 140 and the foot pad 15 are secured in the through hole 110 and the coupler 15 is exposed on the wall 11. A hanger on the ceiling/wall engages in the first engagement hole 141 so that the housing 10 is hung on the ceding/wall. The foot pad 14 and the coupler 15 occupy the same position on the bottom surface 11a, thereby saving space. In addition, the foot pad 14 and the coupler 15 can not interact in assembly.

Figure 7:
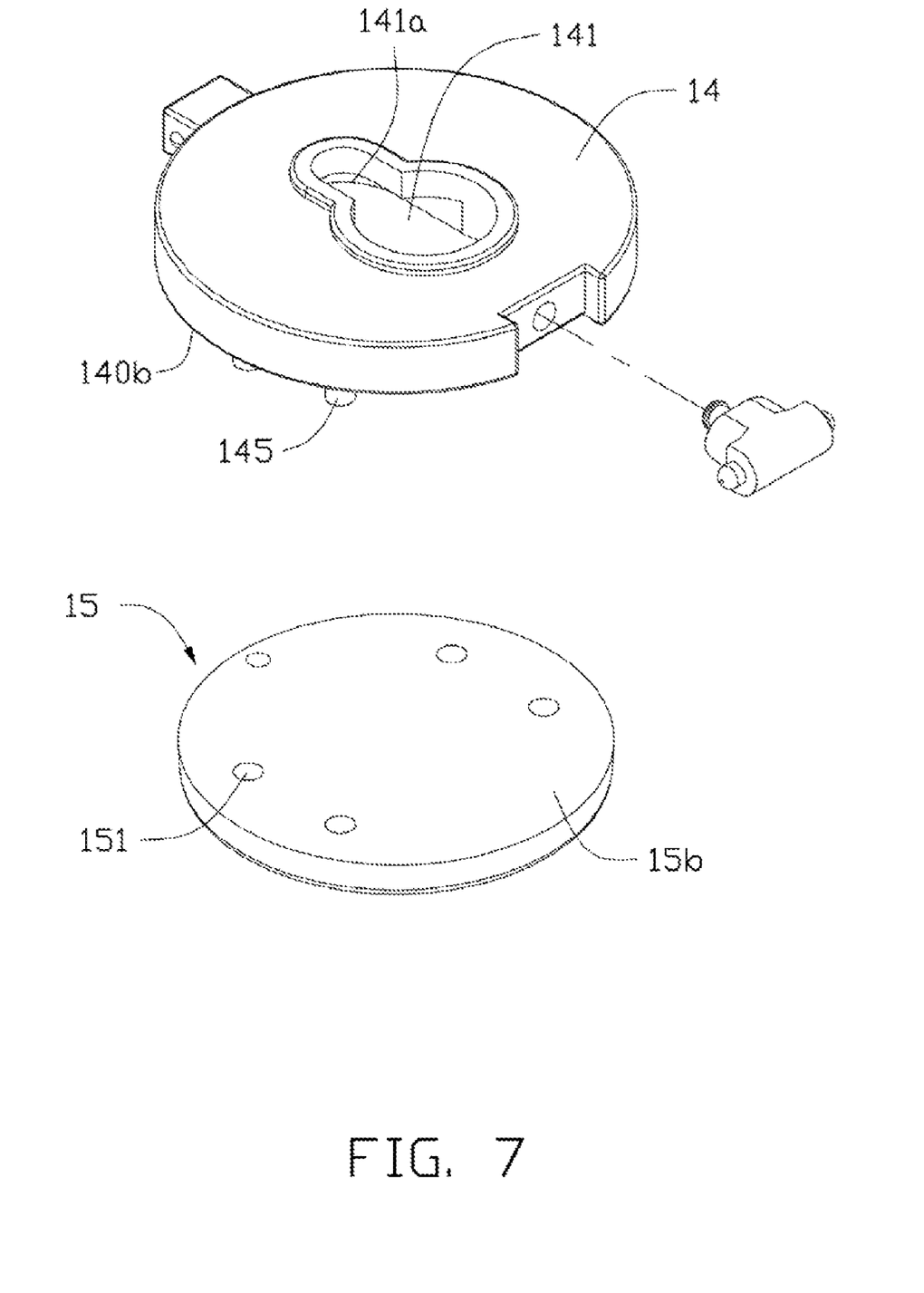
FIG. 7 is a partial exploded view of a housing, according to a second exemplary embodiment.

Referring to FIG. 7, in a second exemplary embodiment, five posts 145 extend from the second surface 140b around the first engagement hole 141. Five second engagement holes 151 are defined in the second plane 15b corresponding to the five posts 145. The posts 145 engage in the respective second engagement holes 151 so that the foot pad 15 is connected to the coupler 14 and seals the opening 141a.

It is to be understood, however, that even though numerous characteristics and advantages of the present embodiments have been set fourth in the foregoing description, together with details of the structures and functions of the embodiments, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A housing comprising:
a wall comprising a bottom surface, a through hole defined in the bottom surface, and a discontinuous ring-shaped engagement member surrounding the through hole, the engagement member having a first gap and a second gap aligned with the first gap;
a connector connected to the engagement member and rotatably engaged in the first gap;
a coupler comprising a main body and an engagement portion, the main body comprising a first surface, a second surface opposite to the first surface, and a circumference surface interconnecting the first surface and the second surface, the engagement portion extending from the circumference surface, a first engagement hole defined in a central portion of the main body through the first surface and the second surface, an opening defined in the second surface surrounding the fist engagement hole, the main body rotatably connected to the connector and receivable in the through hole, the engagement portion engagable in the second gap; and
a foot pad connected to the coupler to seal the opening, the foot pad and the coupler being jointly rotatable relative to the connector to selectively expose the foot pad or the first engagement hole of the coupler toward the through hole, and the foot pad, the coupler and the connector being jointly rotatable to a position in which the combined foot pad and coupler is at least partially received in the through hole.

2. The housing as claimed in claim 1, further comprising a cover, wherein the cover covers the wall.

3. The housing as claimed in claim 1, wherein two fixing holes are defined in two sidewalls of the first gap, the connector comprises a first body portion and a second body portion substantially perpendicular to the first body portion, and two first protrusions extend from opposite sides of the first body portion and rotatably engage in the respective fixing holes.

4. The housing as claimed in claim 3, wherein a blind hole is defined in the circumference surface of the main body, the blind hole is aligned with the engagement portion, and a second protrusion extends from the second body portion and rotatably engages in the blind hole.

5. The housing as claimed in claim 4, wherein a cutout is defined in the circumference surface of the main body, and the blind hole is defined in the circumference surface of the main body at a bottom of the cutout.

6. The housing as claimed in claim 4, wherein the foot pad comprises a first plane and a second plane facing the second surface, a plurality of second engagement holes are defined in the second surface surrounding the first engagement hole, a plurality of posts extend from the second plane, and the posts engage in the respective second engagement holes.

7. The housing as claimed in claim 4, wherein the foot pad comprises a first plane and a second plane facing the second surface, a plurality of second engagement holes are defined in the second plane, a plurality of posts extend from the second surface surrounding the first engagement hole, and the posts engage in the respective second engagement holes.

8. The housing as claimed in claim 6, wherein the foot pad is made of plastic or rubber.

9. The housing as claimed in claim 1, wherein when the foot pad is selected to be exposed toward the through hole and thereupon the combined toot pad and coupler is at least partially received in the through hole, the first engagement hole is exposed at the engagement member for attachment of the housing to an external engaging member; and when the first engagement hole is selected to be exposed toward the through hole and thereupon the combined foot pad and coupler is at least partially received in the through hole, the foot pad is exposed at the engagement member for supporting the housing on an external supporting surface.

10. A housing comprising:
a wall comprising a bottom surface, a through hole defined in the bottom surface, and a discontinuous ring-shaped engagement member surrounding the through hole, the engagement member having a first gap and a second gap aligned with the first gap;
a connector comprising a first body portion and a second body portion substantially perpendicular to the first body portion, the first body portion connected to the engagement member by way of being rotatably engaged in the first gap;
a coupler comprising a main body and an engagement portion, the main body comprising a first surface, a second surface opposite to the first surface, and a circumference surface interconnecting the first surface and the second surface, the engagement portion extending from the circumference surface, a first engagement hole defined in a central portion of the main body through the first surface and the second surface, an opening defined in the second surface surrounding the first engagement hole, the main body rotatably connected to the connector and receivable in the through hole, the engagement portion engagable in the second gap; and
a foot pad connected to the coupler to seal the opening, the foot pad and the coupler being jointly rotatable relative to the second body portion about a lengthwise axis of the second body portion to selectively expose the foot pad or the first engagement hole toward the through hole, and the foot pad, the coupler and the second body portion being jointly rotatable about a lengthwise axis of the first body portion such that the combined foot pad and coupler is at least partially received in the through hole.

11. The housing as claimed in claim 10, further comprising a cover, wherein the cover covers the wall.

12. The housing as claimed in claim 10, wherein two fixing holes are defined in two sidewalls of the first gap, and two first protrusions extend from opposite sides of the first body portion and rotatably engage in the respective fixing boles.

13. The housing as claimed in claim 12, wherein a blind hole is defined in the circumference surface of the main body, the blind hole is aligned with the engagement portion, and a second protrusion extends from the second body portion and rotatably engages in the blind hole.

14. The housing as claimed in claim 13, wherein a cutout is defined in the circumference surface of the main body, and the blind hole is defined in the circumference surface of the main body at a bottom of the cutout.

15. The housing as claimed in claim 13, wherein the foot pad comprises a first plane and a second plane facing the second surface, a plurality of second engagement holes are defined in the second surface surrounding the first engagement hole, a plurality of posts extend from the second plane, and the posts engage in the respective second engagement holes.

16. The housing as claimed in claim 13, wherein the foot pad comprises a first plane and a second plane facing the second surface, a plurality of second engagement holes are defined in the second plane, a plurality of posts extend from the second surface surrounding the first engagement hole, and the posts engage in the respective second engagement holes.

17. The housing as claimed in claim 15, wherein the foot pad is made of plastic or rubber.

18. The housing as claimed in claim 10, wherein when the foot pad is selected to be exposed toward the through hole and thereupon the combined foot pad and coupler is at least partially received in the through hole, the first engagement hole is exposed at the engagement member for attachment of the housing to an external engaging member; and when the first engagement hole is selected to be exposed toward the through hole and thereupon the combined foot pad and coupler is at least partially received in the through hole, the foot pad is exposed at the engagement member for supporting the housing on an external supporting surface.

* * * * *